(12) United States Patent
Tsai et al.

(10) Patent No.: US 8,431,950 B2
(45) Date of Patent: Apr. 30, 2013

(54) LIGHT EMITTING DEVICE PACKAGE STRUCTURE AND FABRICATING METHOD THEREOF

(76) Inventors: Chia-Lun Tsai, Tainan (TW); Ching-Yu Ni, Hsinchu (TW); Wen-Cheng Chien, Hsinchu (TW); Shang-Yi Wu, Hsinchu (TW); Cheng-Te Chou, Sijhih (TW)

( * ) Notice: Subject to any disclaimer, the term of this patent is extended or adjusted under 35 U.S.C. 154(b) by 710 days.

(21) Appl. No.: 12/471,255

(22) Filed: May 22, 2009

(65) Prior Publication Data

US 2009/0289273 A1   Nov. 26, 2009

Related U.S. Application Data

(60) Provisional application No. 61/158,691, filed on May 23, 2008.

(51) Int. Cl.
*H01L 33/00* (2010.01)
*H01L 21/00* (2006.01)

(52) U.S. Cl.
USPC   257/99; 257/98; 257/E33.067; 257/E33.068; 257/E33.069; 257/E33.07; 438/27; 438/31; 438/112; 438/113

(58) Field of Classification Search .................. 257/774, 257/783, E33.057, 98, 99, E33.066–E33.07; 438/27, 31, 112–113
See application file for complete search history.

(56) References Cited

U.S. PATENT DOCUMENTS

| | | | |
|---|---|---|---|
| 6,777,767 B2 * | 8/2004 | Badehi | 257/432 |
| 6,964,877 B2 * | 11/2005 | Chen et al. | 438/20 |
| 7,038,288 B2 * | 5/2006 | Lai et al. | 257/448 |
| 7,675,075 B2 * | 3/2010 | Nagai | 257/90 |
| 2001/0018236 A1 * | 8/2001 | Badehi | 438/127 |
| 2004/0129991 A1 * | 7/2004 | Lai et al. | 257/433 |
| 2005/0156189 A1 * | 7/2005 | Deguchi et al. | 257/103 |
| 2007/0249095 A1 * | 10/2007 | Song et al. | 438/113 |
| 2008/0111228 A1 * | 5/2008 | Yu et al. | 257/690 |
| 2008/0258258 A1 * | 10/2008 | Horikoshi et al. | 257/532 |
| 2008/0258285 A1 * | 10/2008 | Harper et al. | 257/686 |

FOREIGN PATENT DOCUMENTS

| | | |
|---|---|---|
| CN | 1937266 | 3/2007 |
| TW | 200739933 | 10/2007 |

* cited by examiner

*Primary Examiner* — Matthew W Such
*Assistant Examiner* — Jeremy Joy
(74) *Attorney, Agent, or Firm* — Liu & Liu

(57) ABSTRACT

A light emitting device package structure is described. The light emitting device package structure includes a substrate serving as a carrier supporting a light emitting device chip. The substrate and the light emitting device chip have a chip side and a substrate side separately. A first electrode layer is disposed on a first surface of the light emitting device chip and a second electrode layer is disposed on a second surface of the light emitting device chip, in which the first surface and the second surface are not coplanar. A first conductive trace is electrically connected to the first electrode layer and a second conductive trace is electrically connected to the second electrode layer. At least the first conductive trace or the second conductive trace is formed along the chip side and the substrate side simultaneously.

10 Claims, 16 Drawing Sheets

LIGHT EMITTING DEVICE PACKAGE STRUCTURE AND FABRICATING METHOD THEREOF

CROSS REFERENCE TO RELATED APPLICATIONS

This application claims the benefit of U.S. Provisional Application No. 61/128,691 filed May 23, 2008, the entirety of which is incorporated by reference herein.

BACKGROUND OF THE INVENTION

1. Field of the Invention

The present invention relates to a light emitting device package structure and a method for fabricating thereof, and more particularly, relates to a light emitting device package structure with a small size and low heat resistance and a method for fabricating thereof.

2. Description of the Related Art

Light emitting diodes (LEDs) have low volume, good luminance efficiency and fast operating speed and as such, play an important role in many applications including illumination devices or display products. LEDs, initially, have been applied in cellular phones and small sized devices such as remote controllers. With advanced development of high powered and high brightness LEDs, LEDs are now being applied in automobiles, illumination devices and large outdoor display products. However, along with high power and high brightness for LEDs, especially for backlight and electronic illumination applications, heat increases and heat dissipation becomes more of a problem. The conventional wire-bonding type LED package structure has poor heat dissipating efficiency. Thus, a high power and high brightness LED, packaged with the conventional wire-bonding type LED package structure, may not be able to dissipate heat effectively, resulting in an increased operating temperature. Therefore, it this example, the conventional LED package structure is non-durable, deteriorates relatively quickly and has a relatively short lifespan.

FIG. 1 shows a conventional light emitting diode package structure 100, wherein an LED chip 31 is connected to a silicon sub-mount chip 30 by a soldering process or by a thermal pad using a bonding process. The LED chip 31 is electrically connected to a leadframe 34 by a golden wire 32 using a wire binding process. The silicon sub-mount chip 30 is connected to an underlying heat-sinking slug 37. A silicon sealing glue 36 is used to fix the LED chip 31. A lens 35 is disposed on the silicon sealing glue 36. A plastic case 38 is combined with the leadframe 34, the heat-sinking slug 37 and the silicon sealing glue 36 to form a package structure. Therefore, due to the fabrication process, the throughput can not be improved. Specifically, when an LED of the conventional LED package structure is arranged in a pixel array for illumination or display, pitch between each LED can not be scaled down due to the large leadframe and plastic case area. Therefore, pixel continuity and visual effect is hindered.

As such, a novel light emitting device package structure with smaller size and lower heat resistance than the conventional LED package structure and a method for fabricating thereof are desirable.

BRIEF SUMMARY OF INVENTION

The invention provides a light emitting device package structure and a method for fabricating thereof. An exemplary embodiment of the light emitting device package structure comprises a light emitting device chip and a substrate serving as a carrier supporting the light emitting device chip. The substrate and the light emitting device chip have a chip side and a substrate side separately. A first electrode layer is disposed on a first surface of the light emitting device chip and a second electrode layer is disposed on a second surface of the light emitting device chip, in which the first surface and the second surface are not coplanar. A first conductive trace is electrically connected to the first electrode layer and a second conductive trace is electrically connected to the second electrode layer. At least the first conductive trace or the second conductive trace is formed along the chip side and the substrate side simultaneously.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
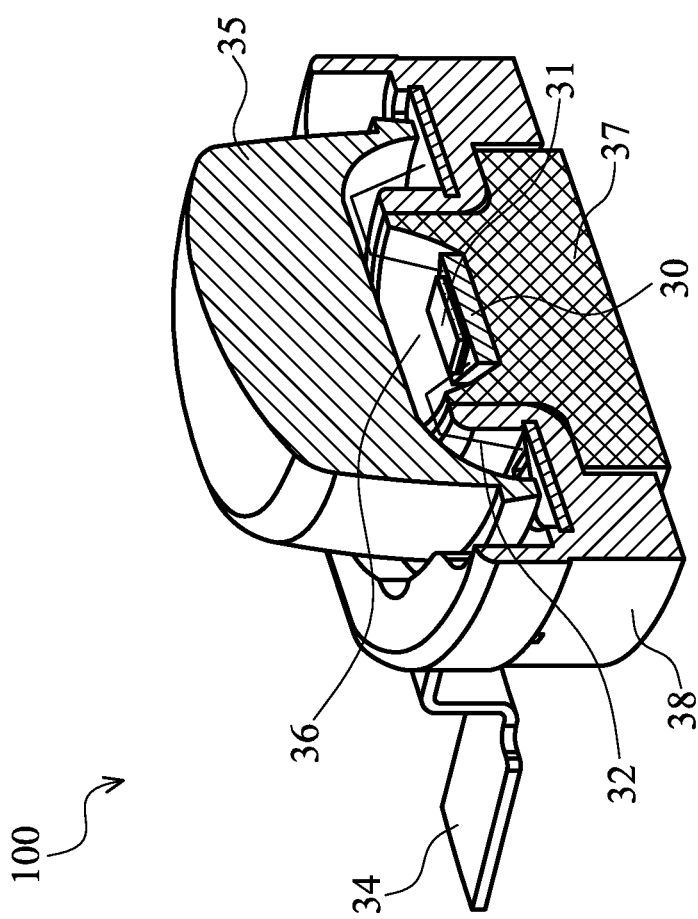
FIG. 1 shows a conventional light emitting diode package structure.

The following description is of a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto but is only limited by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Figure 2A:
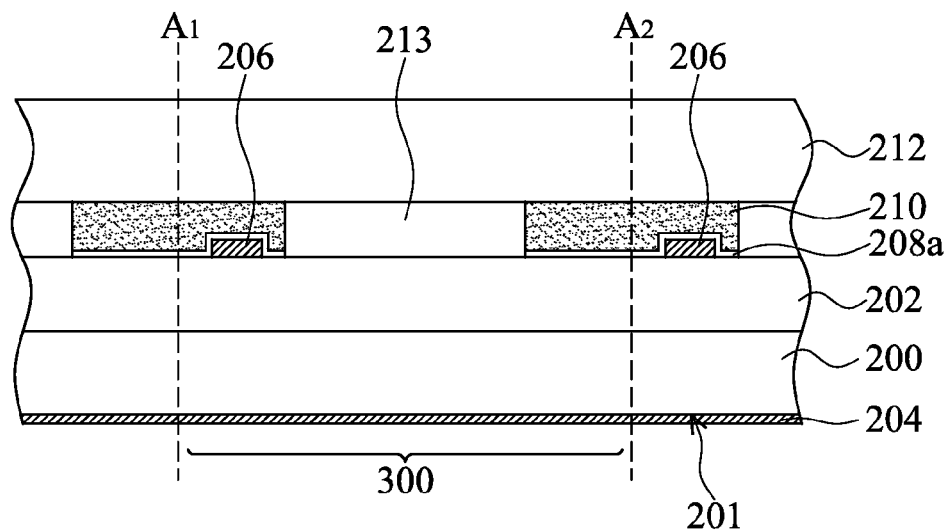
FIGS. 2a to 2c are cross sections illustrating one exemplary embodiment of steps for fabricating a light emitting device package structure of the invention.
Figure 2B:
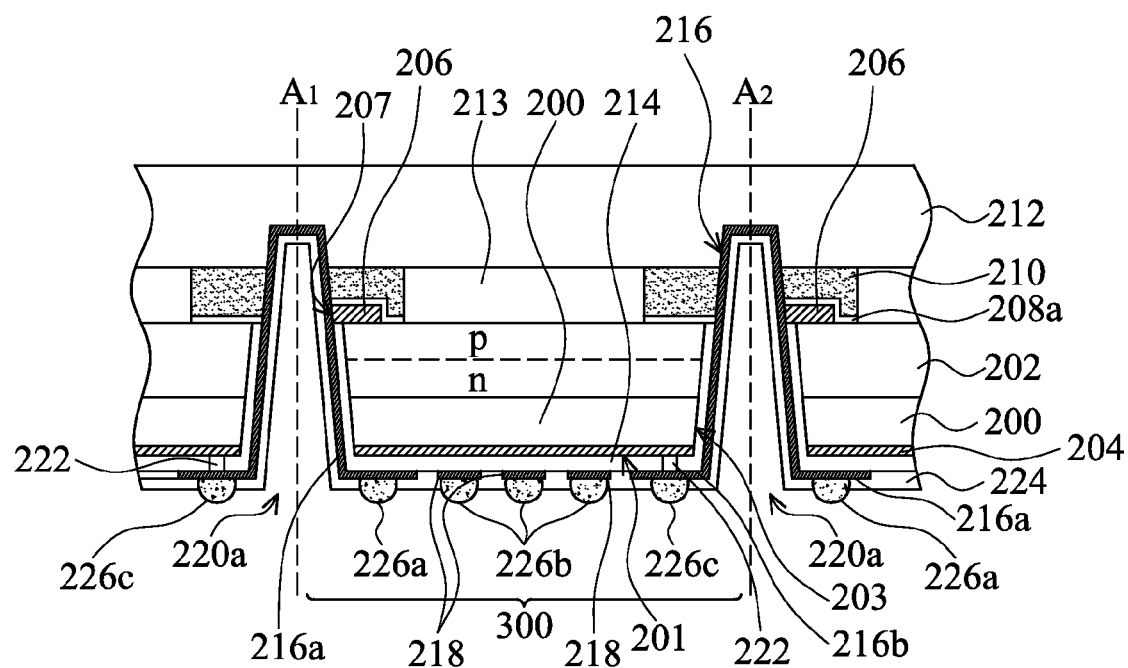
Figure 2C:
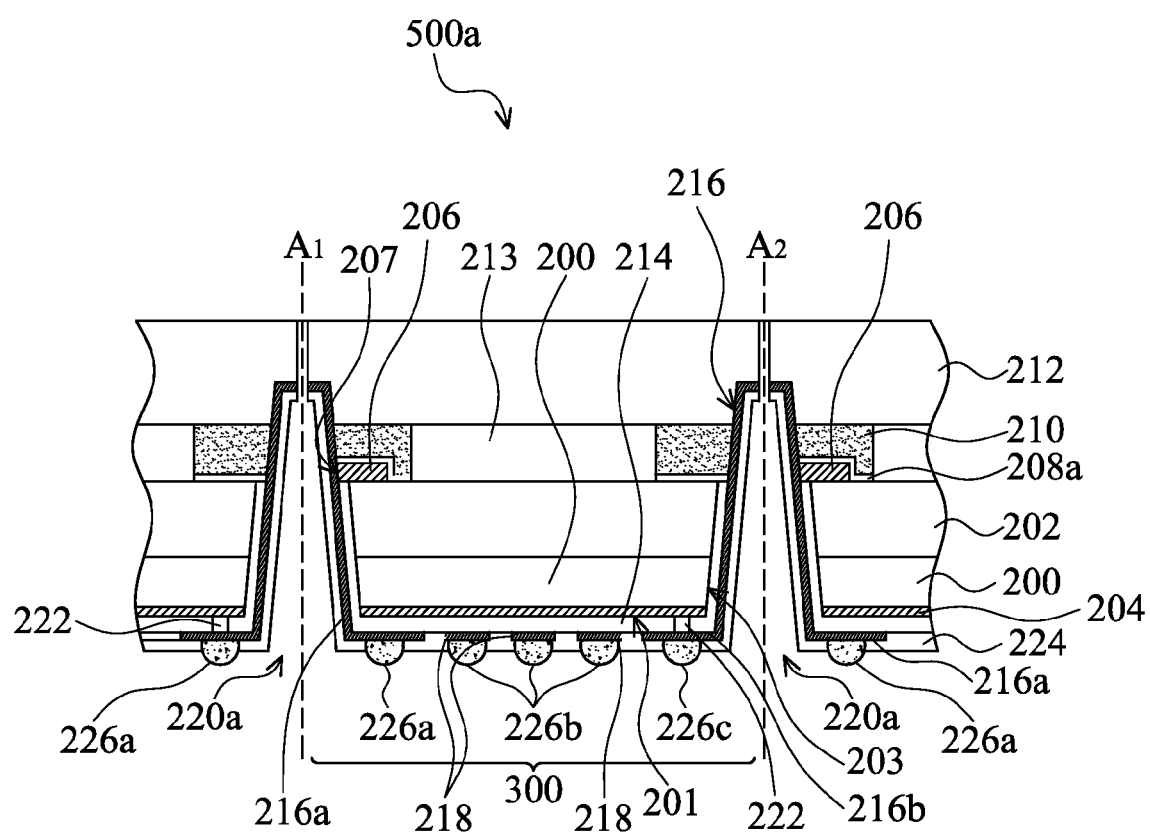

In accordance with an embodiment of the present invention, embodiments of a light emitting device package structure are provided. FIGS. 2a to 2c are cross sections illustrating one exemplary embodiment of steps for fabricating a light emitting device package structure of the invention. In one embodiment, the light emitting device package structure is fabricated using a wafer level chip scale package (WLCSP) process to package a light emitting device, for example, a light emitted diode (LED) or laser diode (LD). The wafer level chip scale package process mentioned above mainly means that after the package process is accomplished during the wafer stage, the wafer with chips is cut to obtain separate independent packages. However, in an embodiment of the invention, separate independent chips may be redistributed overlying a supporting wafer serving as a carrier and then be packaged, which may also be referred to as a wafer scale package process. In addition, the above mentioned wafer scale package process may also be adapted to form electronic device packages of multi-layer integrated circuit devices by stacking a plurality of wafers having integrated circuits.

Referring to FIG. 2a, a wafer 200 having a plurality of light emitting device chips 300 thereon is first provided. Each light emitting device chip 300 is separated by scribe lines $A_1$ and $A_2$. The wafer 200 may comprise transparent semiconductor materials or dielectric materials. The transparent semiconductor materials may comprise group III nitride semiconductors (for example, GaN), group III phosphide semiconductors (for example, GaP), group III arsenide semiconductors (for example, AlGaAs), group III-V semiconductors (for example, ZnS, ZnSe, CdSe or CdTe), silicon carbon, germanium, silicon or alloys thereof. The dielectric materials may comprise diamond, yttrium aluminum garnet (YAG), metal oxide, metal fluoride, optical glasses or chalcogenide glasses. For example, metal oxide may comprise aluminum oxide (sapphire), tungsten oxide, tellurium oxide, titanium oxide, nickel oxide, zirconium oxide (cubic zirconia), indium oxide, tin oxide, barium oxide, strontium oxide, calcium oxide, zinc oxide, gallium oxide, antimony oxide, molybdenum oxide, chromium oxide, lead oxide or bismuth oxide. Metal fluoride may comprise calcium fluoride or magnesium fluoride. The optical glasses may comprise Schott glasses SF57, SF59, SFL56, LaSF, LaSFN9, LaSFN18, and LaSFN30 or Ohara glass PBH71. Chalcogenide glasses may comprise (Ge, Sb, Ga)(S, Se) glass. In one embodiment, the wafer 200 may comprise aluminum oxide ($Al_2O_3$), gallium arsenide (GaAs), silicon (Si) or silicon carbon (SiC). Each light emitting device chip 300 may comprise a semiconductor layer 202, a first electrode layer 206 and a second electrode layer 204. The semiconductor layer 202 is formed on the wafer 200. The semiconductor layer 202 may be a semiconductor layer having a region in which a pn junction is to be formed. The first electrode layer 206 is disposed on the semiconductor layer 202, and is electrically connected to a surface of the semiconductor layer 202. For example, the first electrode layer 206 may electrically connect to a p-type region of the semiconductor layer 202. The second electrode layer 204 is disposed on a backside 201 of the wafer 200, and is electrically connected to another surface of the semiconductor layer 202 through the wafer 200. For example, the second electrode layer 204 may electrically connect to an n-type region of the semiconductor layer 202. In one embodiment, the first electrode layer 206 and the second electrode layer 204 are respectively electrically connected to regions with different conductive types of the semiconductor layer 202. Therefore, the first electrode layer 206 and the second electrode layer 204 may serve as a p-type electrode and an n-type electrode, respectively. Alternatively, a reflector layer (not shown) may be disposed in the semiconductor layer 202 for luminance efficiency enhancement. Additionally, electronic devices (not shown), for example, photo diodes, may be disposed electrically connected to the semiconductor layer 202 to control brightness of the semiconductor layer 202. In one embodiment, the semiconductor layer 202 used for an LED or LD may comprise group III nitride semiconductors, group III phosphide semiconductors, group III arsenide semiconductors, group III-V elements, phosphorus compounds or the like. For example, the semiconductor layer 202 may comprise GaN, AlN, InN, BN, AlInN, GaInN, AlGaN, BAlN, BInN, BGaN, BAlGaInN, AlP), GaP, InP, AlGaP, GaInP, GaAsP, InGaAlP, GaInPN, GaInAsP, AlAs, GaAs, InAs, GaAlAs, GaInAs, AlGaInAs, GaInAsN or GaAsSb.

Next, a cavity 213 is formed on each light emitting device chip 300 between the semiconductor wafer 310 and an overlying covering plate 212, covering a light emitting surface of the light emitting device chip 300 (for example, an top surface of the semiconductor layer 202). Formation of the cavity 213 can be performed by, for example, forming an adhesive layer 208a surrounding each light emitting device chip 300 and on the scribe lines $A_1$ and $A_2$. Next, a spacer structure 210 is formed on the adhesive layer 208a. The light emitting device chip 300 and the covering plate 212 are oppositely assembled with a spacer structure 210 interposed between the first electrode layer 206 and the covering plate 212. Therefore, the cavity 213 is formed between the light emitting device chip 300 and an overlying covering plate 212. In one embodiment, the adhesive layer 208a can be made of insulating materials, for example, epoxy, silicone or benzocyclobutene (BCB). The spacer structure 210 can also be made of insulating materials, for example, epoxy, silicone or benzocyclobutene (BCB). The covering plate 212 may direct transmission of light from the semiconductor layer 202 to the outside. The covering plate 212 may be composed of transparent materials, for example, lens quality glass or quartz. The covering plate 212 may be used to avoid material deterioration of a package resin used in the conventional light emitting devices.

Next, referring to FIG. 2b, each light emitting device chip 300 is separated and isolated along the scribe lines $A_1$ and $A_2$ in the following steps. A portion of the wafer 200 is removed from a backside 210 of the wafer 200 until the semiconductor layer 202 is exposed using a selective removal processes. For example, photolithography and etching processes can be used, thereby forming trenches (not shown) in positions where the scribe lines $A_1$ and $A_2$ are located. An insulating layer 214 is then conformably formed on the backside 210 of the wafer 200 and sides 203 of the trenches. Formation of the insulating layer 214 can be performed by a chemical vapor deposition (CVD), physical vapor deposition (PVD), sputtering, printing, ink-jet method, immersion plating, spray coating or spin coating process. The insulating layer 214 can be made of epoxy, polyimide, resin, silicon oxide, metal oxide, or silicon nitride.

Next, trenches 220a are formed in positions where the scribe lines $A_1$ and $A_2$ are located, by exposing a side 207 of the first electrode layer 206 overlying the wafer 200 and a portion of a bottom surface of the second electrode layer 204 underlying the wafer 200. Formation of the trenches 220a can be performed by a selective removal processes. For example, photolithography and etching processes can be used to remove a portion of the insulating layer 214, a portion of the spacer structure 210, a portion adhesive layer 208a and a portion covering plate 212, which are on a bottom of the aforementioned formed trenches. Therefore, the trenches 220a are formed in positions where the scribe lines $A_1$ and $A_2$ are located, by exposing the side 207 of the first electrode layer 206. As shown in FIG. 2b, the trench 220a is formed through the wafer 200, the semiconductor layer 202, the spacer structure 210, the adhesive layer 208 and a portion of the covering plate 212 from the backside 201 of the wafer 200.

Next, a portion of the insulating layer 214 is removed from the backside 210 of the wafer 200 until a via hole is formed and the second electrode layer 204 is exposed, by using a selective removal processes; for example, photolithography and etching processes.

Next, a conductive structure respectively electrically connecting the side 207 of the first electrode layer 206 and the bottom surface of the second electrode layer 204 is formed. Formation of the conductive structure may be performed by, for example, an electric plating or CVD process, to fill conductive materials such as metal into the via hole. A via plug 222 is then formed on the bottom surface of the second electrode layer 204 of each light emitting device chip 300. In one embodiment, the via plug 222 may provide an output that electrically connects with the second electrode layer 204.

Next, a conductive layer (not shown) is conformably formed on the backside 201 of the wafer 200 and an inner wall of the trench 220a. Alternatively, the via plug 222 and the conductive layer may be formed in one step. The conductive layer is then patterned using a selective removal processes. For example, photolithography and etching processes can be used to remove a portion of the conductive layer on the backside 201 of the wafer 200. Therefore, a plurality of conductive traces 216 and conductive patterns 218 are formed at the same time. The conductive traces 216 are used to provide input/output (10) electrical connections of the semiconductor layer 202, wherein the conductive traces 216 may comprise a first conductive trace 216a and a second conductive trace 216b that respectively electrically connect the first electrode layer 206 overlying the wafer 200 to a portion of a bottom surface of the second electrode layer 204 underlying the wafer 200. Alternatively, when conformably forming the conductive layer on the inner wall of the trench 220a, the conductive layer may cover a side of a light emitting chip or extend to another side of an adjacent chip. Therefore, the conductive layer may totally cover a side of the whole chip without short with the adjacent chip. Therefore, the conductive layer made of metal materials, for example, aluminum, may increase not only heat dissipating efficiency, but also luminance efficiency through reflecting light emitted from the chip.

A position of the via plug 222 may be formed to be away from the first conductive trace 216a. For example, as shown in FIG. 2b, the first electrode layer 206 is formed on a side of an upper region of the light emitting device chip 300 with the first conductive trace 216a extending from the same side, where the first electrode layer 206 is formed, to a lower region of the light emitting device chip 300. Therefore, the via plug 222 may be formed on another side of the lower region of the light emitting device chip 300.

Next, solder balls may be formed on surfaces of the conductive traces 216 and the conductive patterns 218. For example, a solder mask layer 224 may be conformably formed on the backside 201 of the wafer 200 and the inner wall of the trench 220a, covering a portion of the conductive traces 216 and the conductive patterns 218, thereby exposing a predefined terminal contact area. A ball grid array comprising solder balls 226a, 226b and 226c is then formed on the exposed terminal contact area, wherein the conductive solder balls 226a and 226c are formed on the conductive traces 216a and 216b and respectively electrically connect to the first electrode layer 206 and the second electrode layer 204. The solder balls 226b are formed on the conductive patterns 218. The conductive patterns 218 may have a larger area than that of the solder ball 226b. The solder balls 226a, 226b and 226c are coplanar.

Next, referring to the FIG. 2c, the wafer 200 is cut along the scribe lines $A_1$ and $A_2$ to divide the wafer 200 into a plurality of light emitting device package structures 500a.

Elements of the embodiments hereinafter, that are the same or similar as those previously described with reference to FIGS. 2a to 2c, are not repeated for brevity.

Figure 3A:
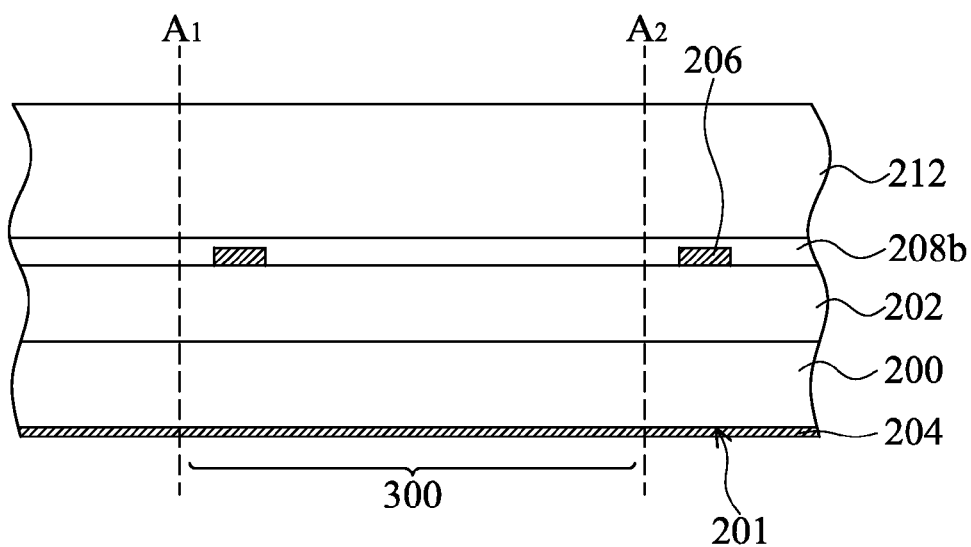
FIGS. 3a to 3c are cross sections illustrating another exemplary embodiment of steps for fabricating a light emitting device package structure of the invention.
Figure 3B:
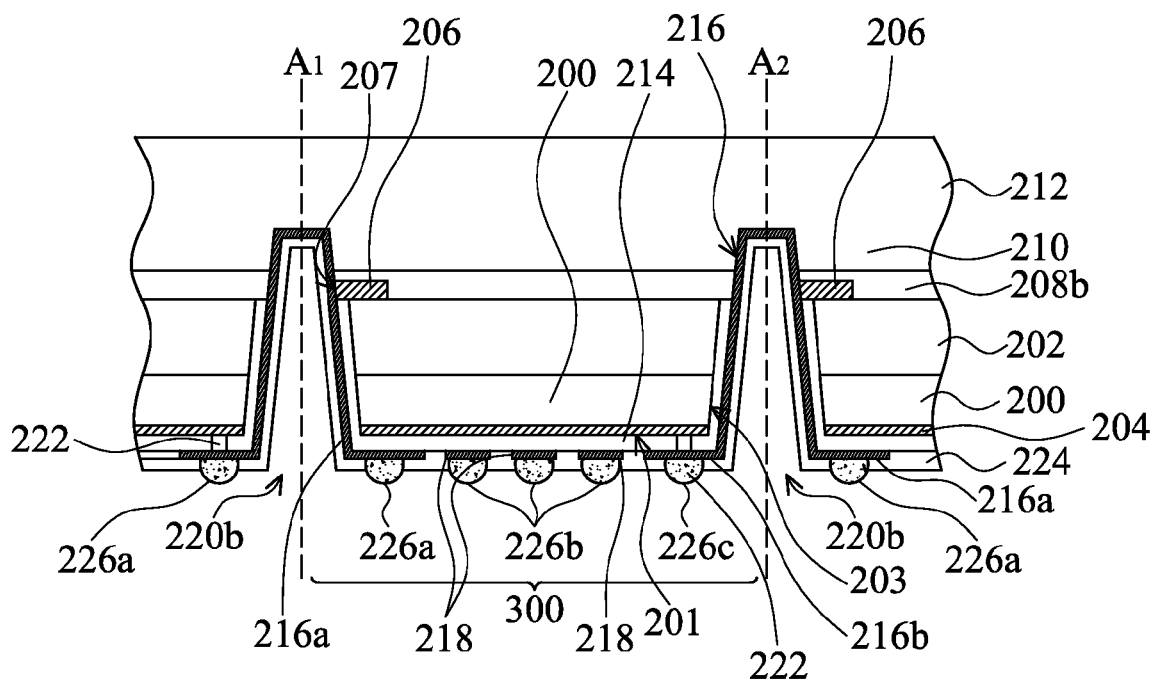
Figure 3C:
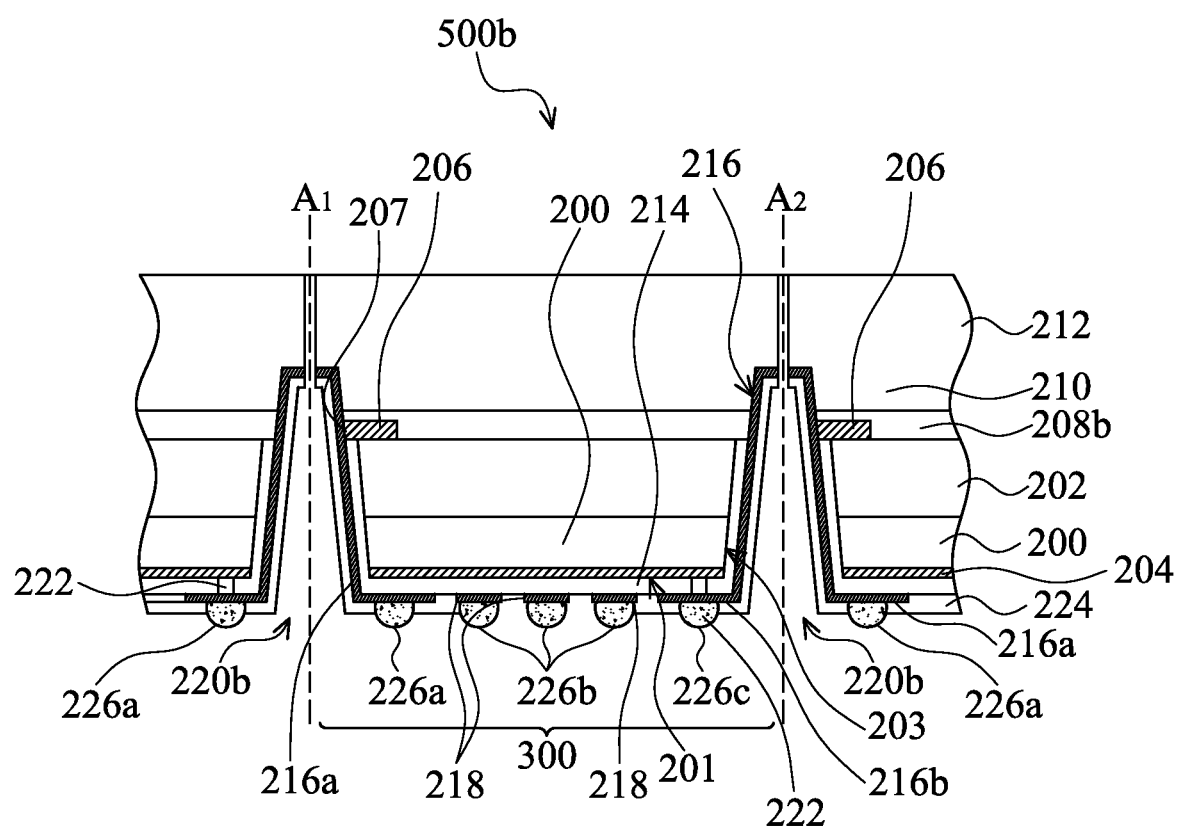

FIGS. 3a to 3c are cross sections illustrating another exemplary embodiment of steps for fabricating a light emitting device package structure of the invention.

Referring to FIG. 3a, an adhesive layer 208b is filled between the wafer 200 and the covering plate 212. The adhesive layer 208b is formed to be attached on the semiconductor layer 202 or the covering plate 212, and then the adhesive layer 208b is laminated with the covering plate 212. Finally, the adhesive layer 208b is solidified.

Next, referring to FIG. 3b, the conductive solder balls 226a and 226c are formed on the conductive traces 216a and 216c. The heat dissipating solder balls 226b are formed on the conductive patterns 218. Next, referring to FIG. 3c, the wafer 200 is cut along the scribe lines $A_1$ and $A_2$ to divide the wafer 200 into a plurality of light emitting device package structures 500b.

Differences between the light emitting device package structures 500a and 500b are described in the following. In the packaged light emitting device chip 500b, the light emitting device chip 300 and the covering plate 212 are bonded without a cavity using the adhesive layer 208b. Additionally, the solder balls 226a, 226b and 226c of the light emitting device package structures 500a and 500b are ball grid array solder balls formed at the same time, but the solder balls 226b are not electrically connected to the conductive traces 216. In one embodiment, the solder balls 226b may serve as heat dissipating solder balls 226b. The number of the solder balls 226b is not limited herein but dependant upon fabricating processes. During operation of the light emitting device package structures 500a and 500b, heat generated from the semiconductor layer 202 may be transferred to the outside of the light emitting device package structures 500a and 500b through the heat dissipating solder balls 226b. In one exemplary embodiment of a light emitting device package structure, a distance between the semiconductor layer 202 and the light emitting device package structures 500a and 500b is much shorter than that of the conventional wire-bonding type light emitting device package structure. Also, the heat dissipating solder balls 226b are directly below the thin insulating layer 214 without being separated by a print circuit board. Therefore, heat generated from the semiconductor layer 202 may transfer to the atmosphere quickly and heat resistance of the light emitting device package structure can be further reduced. The light emitting device package structures 500a and 500b have improved heat dissipating efficiency and reliability.

Additionally, in other embodiments, materials of the wafer 200 or the geometric structure of the light emitting device chip 300 may be changed to improve luminance efficiency and transmittance of the light emitting device chip 300. Also, a higher reflected light efficiency or refracted light utilization of the light emitting device chip 300 can be achieved by changing materials of the wafer 200 or the geometric structure of the light emitting device chip 300.

Figure 4A:
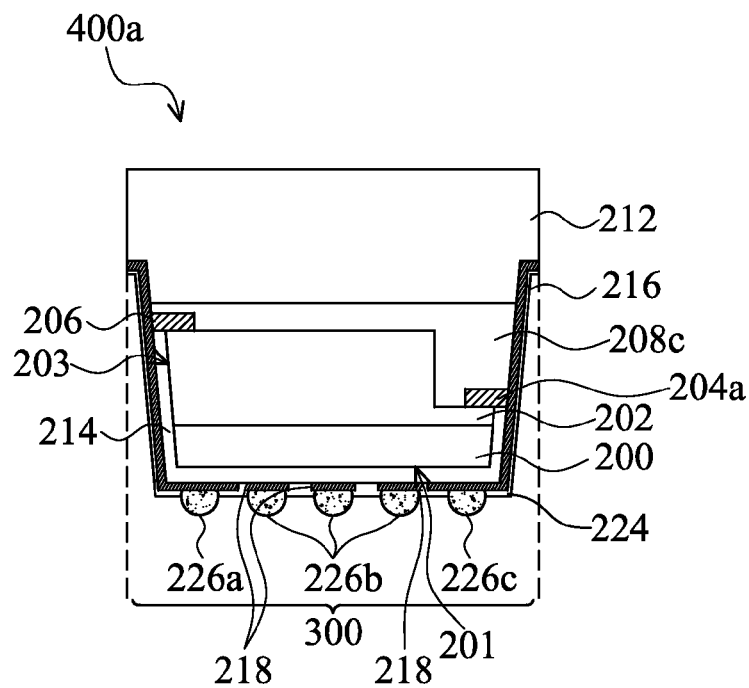
FIGS. 4a to 4b are geometric cross sections of a light emitting device of exemplary embodiments having a light emitting device package structure of the invention.
Figure 4B:
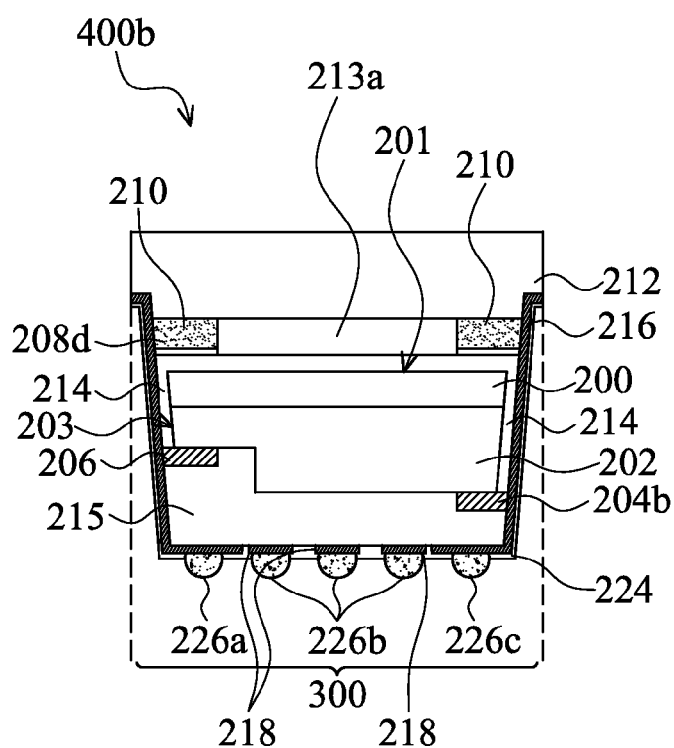

FIGS. 4a to 4b are geometric cross sections of a light emitting device 300 of exemplary embodiments having light emitting device package structures 400a and 400b of the invention. As shown in FIG. 4a, a portion of the semiconductor layer 202, which is formed by laminating p-type and n-type epitaxial layers, may be removed. For example, a portion of the p-type epitaxial layer may be removed to expose a portion of the n-type epitaxial layer, to make the first electrode layer 206 and the second electrode layer 204a of the light emitting device package structure 400a both on the same side (face up) of the wafer 200. The first electrode layer 206 and the second electrode layer 204a are respectively electrically connected to p-type and n-type regions of the semiconductor layer 202. Also, the first electrode layer 206 and the second electrode layer 204a are respectively electrically connected to the solder balls 226a and 226c through the conductive traces 216 on the side 203 of the light emitting device chip 300. In one embodiment, the wafer 200 may comprise semiconductor materials or metal oxide. The semiconductor materials may comprise silicon. Metal oxide may comprise aluminum oxide (sapphire), tungsten oxide, tellurium oxide, titanium oxide, nickel oxide, zirconium oxide (cubic zirconia), indium oxide, tin oxide, barium oxide, strontium oxide, calcium oxide, zinc oxide, gallium oxide, antimony oxide, molybdenum oxide, chromium oxide, lead oxide or bismuth oxide. As shown in FIG. 4a, because the first electrode layer 206 and the second electrode layer 204a of the light emitting device package structure 400a are not coplanar, an adhesive layer 208a may be filled into a cavity among the covering plate 212, the first electrode layer 206 and the second electrode layer 204a. Therefore, the first electrode layer 206 and the second electrode layer 204a may be connected to the covering plate 212 without a cavity.

FIG. 4b illustrates a flip-chip light emitting device package structure 400b. As shown in FIG. 4b, the backside of the wafer 200 of the light emitting device package structure 400b is at the top and attaches to the covering plate 212 through an adhesive layer 208d and the spacer structure 210. The spacer structure 210 is disposed between the wafer 200 and the covering plate 212 to form a cavity therebetween. The first electrode layer 206 and a second electrode layer 204b of the light emitting device package structure 400b are both on the same side (face down) of the wafer 200 and respectively electrically connect to p-type and n-type regions of the semiconductor layer 202. The first electrode layer 206 and the second electrode layer 204a are respectively electrically connected to the solder balls 226a and 226c through the conductive traces 216 on the sides of the light emitting device chip 300. In one embodiment, the wafer 200 may comprise semiconductor materials or metal oxide. The semiconductor materials may comprise silicon. Metal oxide may comprise aluminum oxide (sapphire), tungsten oxide, tellurium oxide, titanium oxide, nickel oxide, zirconium oxide (cubic zirconia), indium oxide, tin oxide, barium oxide, strontium oxide, calcium oxide, zinc oxide, gallium oxide, antimony oxide, molybdenum oxide, chromium oxide, lead oxide or bismuth oxide. As shown in FIG. 4b, because the first electrode layer 206 and the second electrode layer 204b of the light emitting device package structure 400b are not coplanar, a filled insulating layer 215 may be formed on the first electrode layer 206 and the second electrode layer 204b to provide a planarized surface. Therefore, the subsequence solder balls 226a, 226b and 226c may be formed on a flat surface.

Alternatively, various shapes of heat dissipating structures may be formed underlying the light emitting device chip 300 for heat dissipation.

Figure 5A:
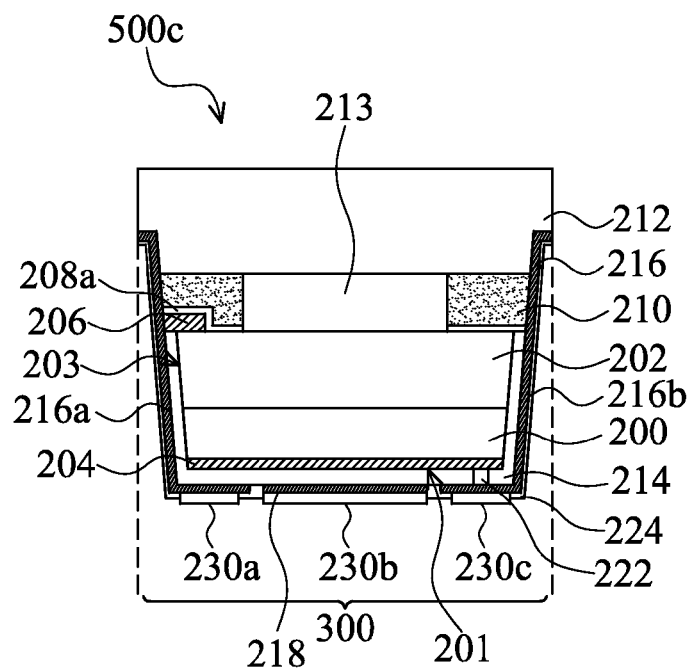
FIGS. 5a to 5b are cross sections of other exemplary embodiments of a light emitting device package structure having heat dissipating pads of the invention.
Figure 5B:
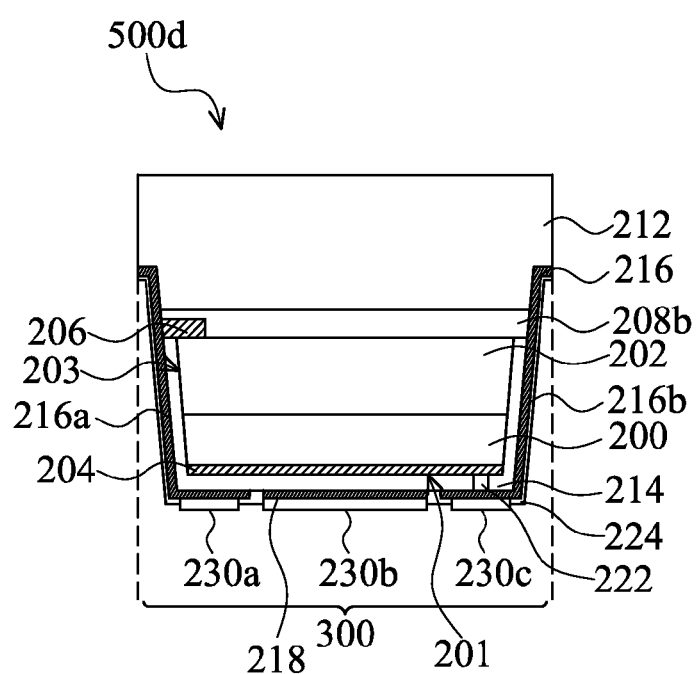
Figure 6A:
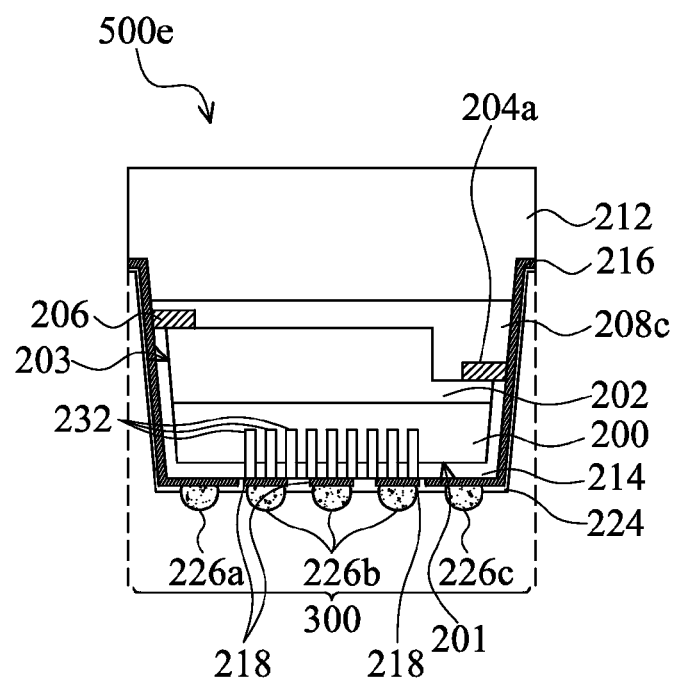
FIGS. 6a to 6b are cross sections of other exemplary embodiments of a light emitting device package structure conducting heat dissipation via plugs of the invention.
Figure 6B:
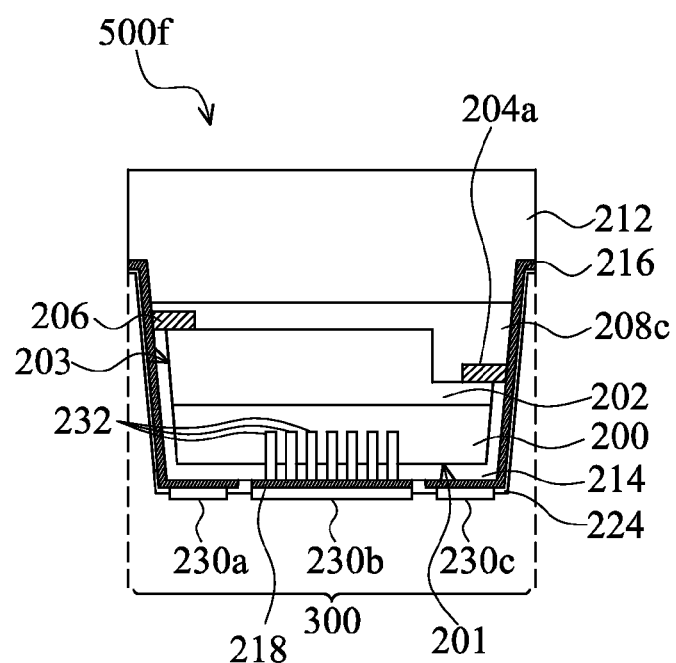
Figure 7A:
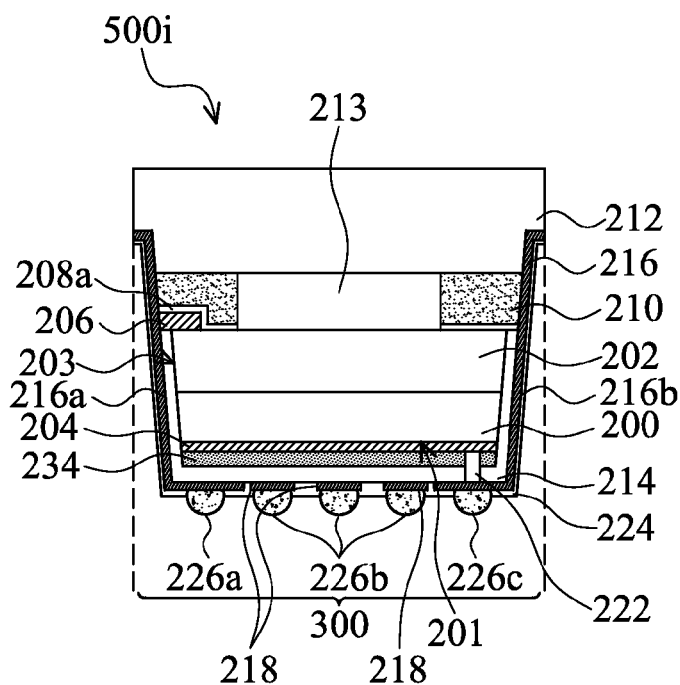
FIGS. 7a to 7d are cross sections of other exemplary embodiments of a light emitting device package structure having an embedded heat dissipating material layer of the invention.
Figure 7B:
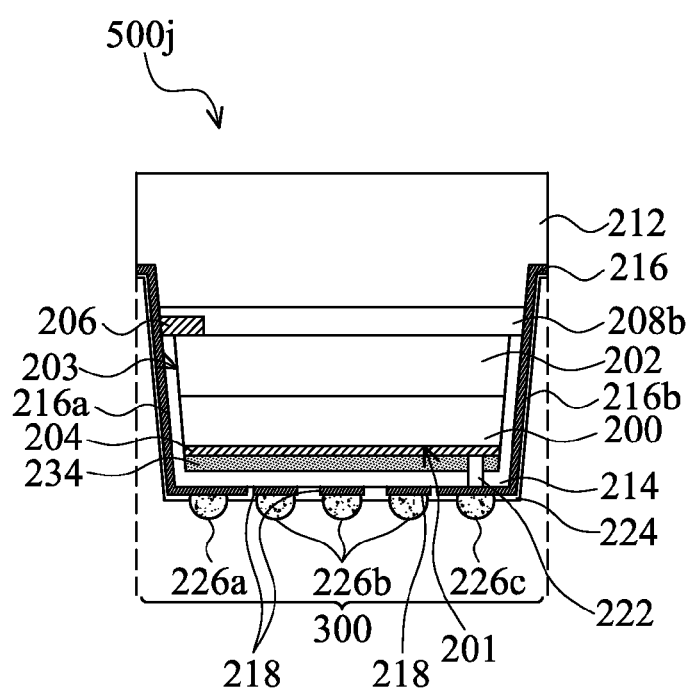
Figure 7C:
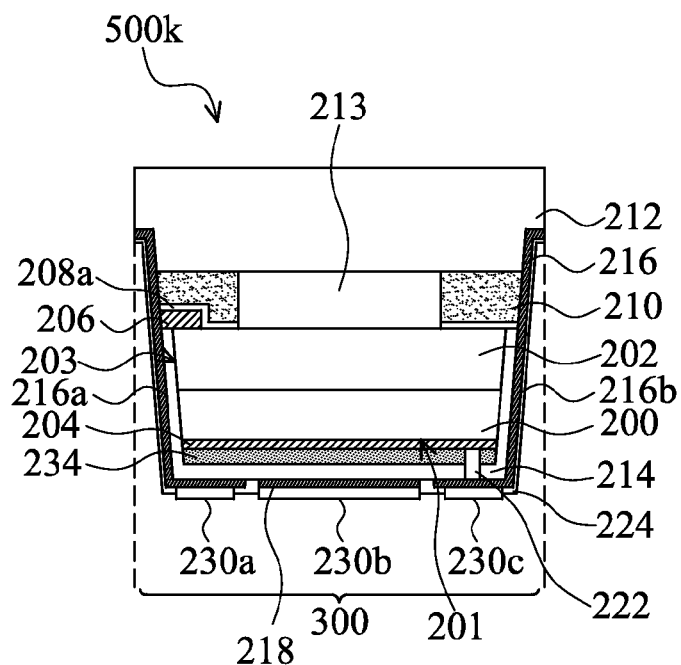
Figure 7D:
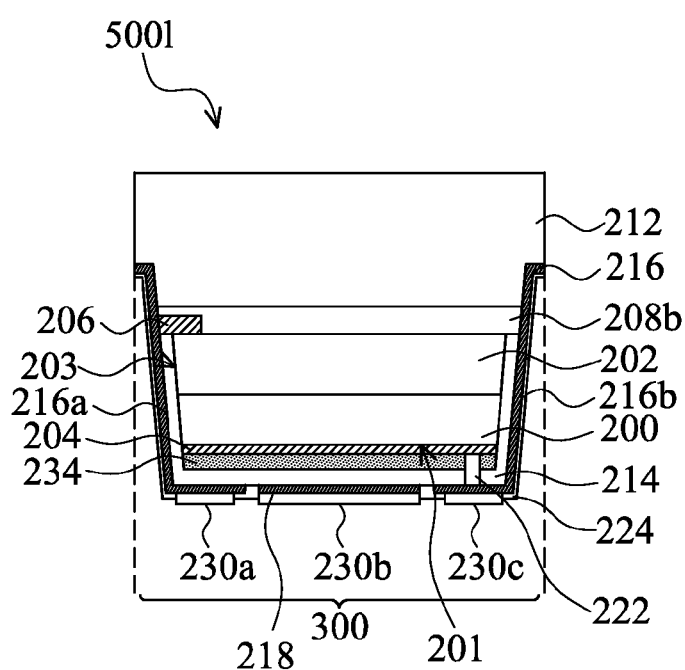

FIGS. 5a to 5b are cross sections of other exemplary embodiments of light emitting device package structures 500c and 500d having heat dissipating pads 230b of the invention. FIGS. 6a to 6b are cross sections of other exemplary embodiments of light emitting device package structures 500e and 500f conducting heat dissipation via plugs 232 of the invention. FIGS. 7a to 7d are cross sections of other exemplary embodiments of a light emitting device package structures 500i, 500j, 500k and 500l having embedded heat dissipating material layers 234 of the invention. FIGS. 5a to 5b illustrate the light emitting device package structures 500c and 500d with the light emitting device chip 300 as shown in FIG. 2c and FIG. 3c, respectively. After formations of the first conductive trace 216a and the second conductive trace 216b, solder pads 230a, 230b and 230c comprising conductive material, for example, solder, may be formed on a portion of the first conductive trace 216a, the second conductive trace 216b and the conductive patterns 218, which are on the backside 201 of the wafer 200, by plating, wherein the solder pads 230a and 230c are electrically connected to the first conductive trace 216a, and the second conductive trace 216b, respectively. The solder pad 230b is formed on the conductive patterns 218. The solder pads 230a, 230b and 230c are coplanar. In one embodiment, the solder pad 230b may serve as a heat dissipating solder pad 230b. The number of the heat dissipating solder pad 230b used is according to design, but not limited to the disclosure herein. Meanwhile, the heat dissipating solder pad 230b may provide a larger heat dissipating area and an improved heat dissipating efficiency because a total area of the heat dissipating solder pad 230b is larger than that of the heat dissipating solder balls 226b. During operation of the light emitting device package structures 500c and 500d, heat generated from the semiconductor layer 202 may transfer to the outside of the light emitting device package structures 500c and 500d through the heat dissipating solder pads 230b. In one exemplary embodiment of a light emitting device package structure, a distance between the semiconductor layer 202 and the light emitting device package structures 500c and 500d is much shorter than that of the conventional wire-bonding type light emitting device package structure for the light emitting device. Also, the heat dissipating solder pads 230b are directly below the thin insulating layer 214 without being separated by a print circuit board. Therefore, the heat generated from the semiconductor layer 202 may transfer to the atmosphere quickly and heat resistance of the light emitting device package structure can be further reduced. The light emitting device package structures 500c and 500d may have improved heat dissipating efficiency and reliability. For example, a software ANSYS® ICE PAK provided by ANSYS Corp. is used to evaluate the heat dissipating efficiency of the light emitting device package structure 500d with a high power light emitting diode (>1 watt) serving as the semiconductor layer 202. The thermal resistance of the light emitting device package structure 500d is about 0.08 K/W, which is much smaller than 5K/W of the conventional wire-bonding type leadframe-based light emitting device package structure. The heat resistance evaluation result shows one exemplary embodiment of the light emitting device package structure having a better heat dissipating efficiency than the conventional wire-bonding type leadframe-based light emitting device package structure.

FIGS. 6a to 6b are cross sections of other exemplary embodiments of light emitting device package structures 500e and 500f conducting heat dissipation via plugs 232 of the invention. FIGS. 6a to 6b illustrate the light emitting device package structures 500e and 500f with the light emitting device chip 300 as shown in FIG. 4a. Before formation of the conductive traces 216 and the conductive patterns 218, a portion of the insulating layer 214 and the wafer 200 are removed from the backside 201 of the wafer 200 to a plurality of via holes (not shown) through the wafer 200 by, for example, laser drilling process. Next, conductive materials may be filled into the via holes to form via plugs 232 through the wafer 200 by, for example, an electric plating or chemical vapor deposition (CVD) process. In one embodiment, the via plugs 232 may serve as heat dissipating via plugs 232 formed from the backside 201 of the wafer 200 and extending into the wafer 200 The heat dissipating via plugs 232 are electrically connected to the solder balls 226a, 226b and 226c or the solder pads 230a, 230b and 230c, thereby providing another heat dissipating path from the wafer 200 to the outside of the light emitting device package structures 500e and 500f. Heat generated from the semiconductor layer 202 may transfer from the wafer 200 to the outside of the light emitting device package structures 500e and 500f quickly by the solder balls 226a, 226b and 226c or the solder pads 230a, 230b and 230c. In one exemplary embodiment of a light emitting device package structure, a distance between the semiconductor layer 202 and the light emitting device package structures 500e and 500f is much shorter than that of the conventional wire-bonding type light emitting device package structure for the light emitting device. Also, the solder balls 226a, 226b and 226c or the solder pads 230a, 230b and 230c are directly below the thin insulating layer 214, which is on the backside 201 of the wafer 200, without being separated by a print circuit board. Therefore, heat generated from the semiconductor layer 202 may transfer to the atmosphere quickly and heat resistance of the light emitting device package structure can be further reduced. The light emitting device package structures 500e and 500f have improved heat dissipating efficiency and reliability.

FIGS. 7a to 7d are cross sections of other exemplary embodiments of a light emitting device package structures 500i, 500j, 500k and 500l having embedded heat dissipating material layers 234 of the invention. FIGS. 7a to 7d illustrate the light emitting device package structures 500i, 500j, 500k and 500l with the light emitting device chip 300 as shown in FIG. 2c and FIG. 3c. Before forming the insulating layer 214, a heat dissipating material layer 234 may be formed underlying the second electrode layer 204. The heat dissipating material layer 234 comprising metal may be formed by an electric plating or physical vapor deposition (PVD) process. The heat dissipating material layer 234 is embedded in the light emitting device package structures 500i, 500j, 500k and 500l, between the second electrode layer 204 and the insulating layer 214. The heat dissipating material layer 234 may provide another heat dissipating path from the wafer 200 to the outside of the light emitting device package structures 500i, 500j, 500k and 500l. During operation of the light emitting device package structures 500i, 500j, 500k and 500l, heat generated from the semiconductor layer 202 may transfer to the outside of the light emitting device package structures 500i, 500j, 500k and 500l through the heat dissipating material layer 234, the heat dissipating solder balls 226b and the heat dissipating solder pads 230b. In one exemplary embodiment of a light emitting device package structure, a distance between the semiconductor layer 202 and the light emitting device package structures 500i, 500j, 500k and 500l is much shorter than that of the conventional wire-bonding type light emitting device package structure for the light emitting device. Also, the heat dissipating material layer 234, the heat dissipating solder balls 226b and the heat dissipating solder pads 230b are directly below the thin insulating layer 214 without being separated by a print circuit board. Therefore, heat generated from the semiconductor layer 202 may transfer to the atmosphere quickly and heat resistance of the light emitting device package structure can be further reduced. The light emitting device package structures 500i, 500j, 500k and 500l have improved heat dissipating efficiency and reliability.

As shown in FIGS. 7a to 7d, a conductive via plug 222 may be formed on a surface of the heat dissipating material layer 234 without being in contact with the second electrode 204 if the heat dissipating material layer 234 comprises conductive materials.

Figure 8A:
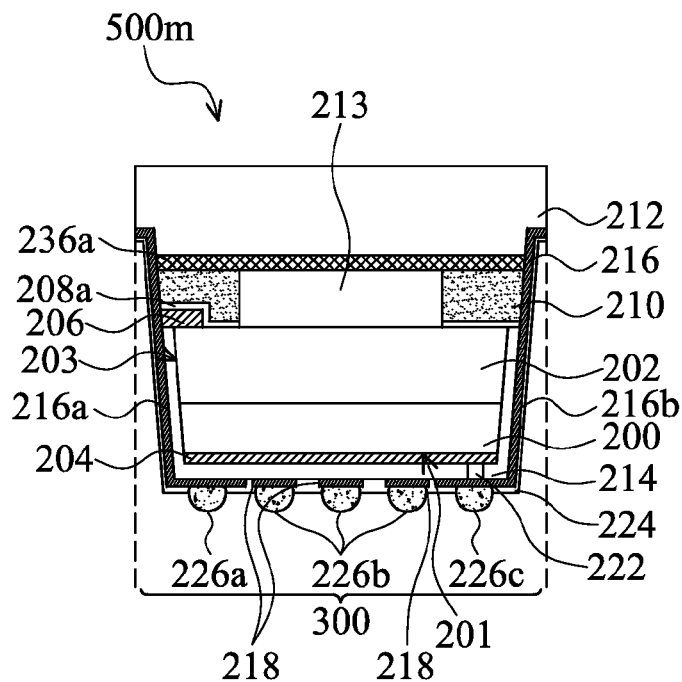
FIGS. 8a to 8d are cross sections of other exemplary embodiments of a light emitting device package structure having a fluorescent layer of the invention.
Figure 8B:
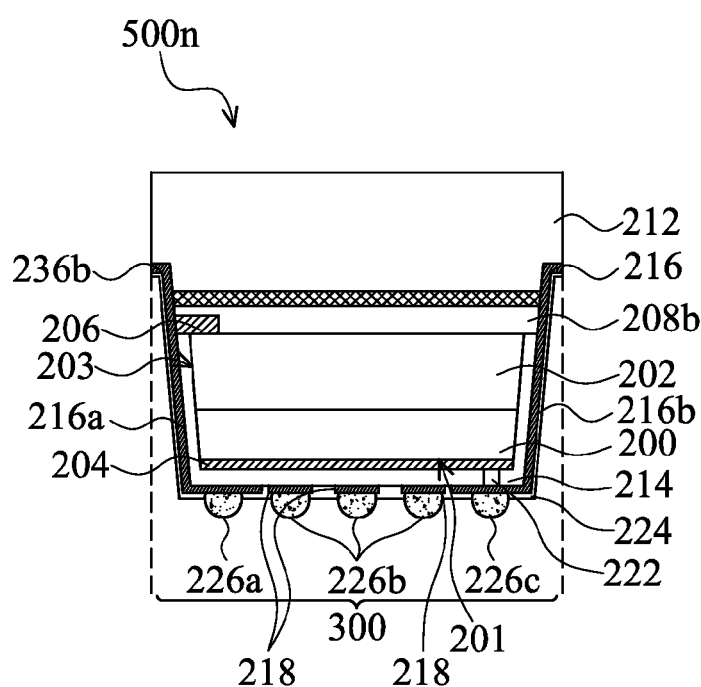
Figure 8C:
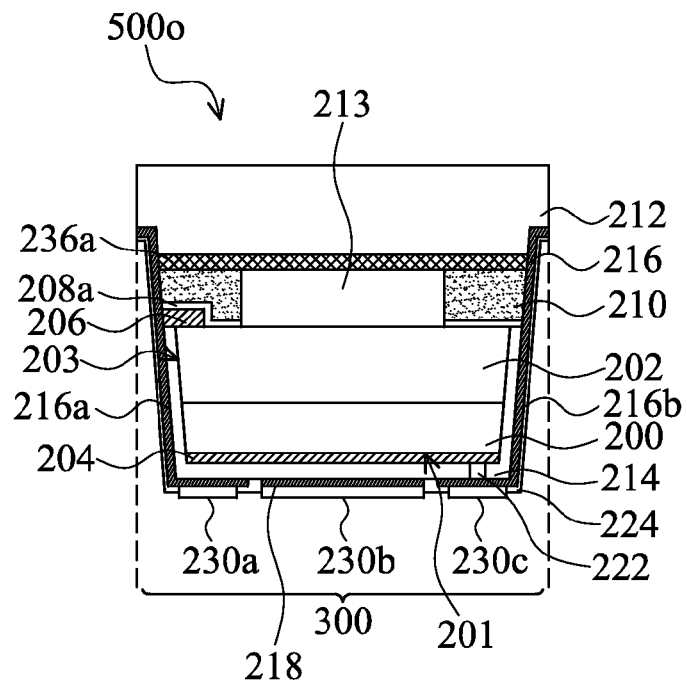
Figure 8D:
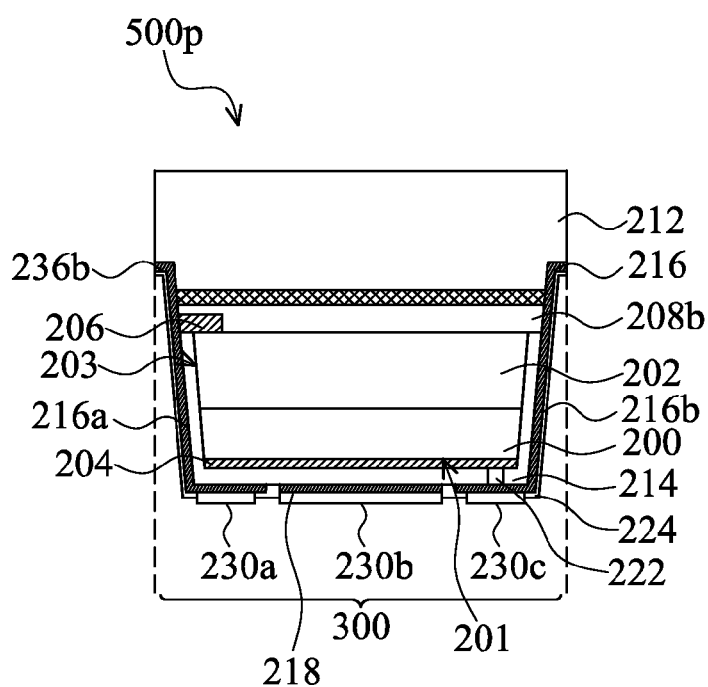

FIGS. 8a to 8d are cross sections of other exemplary embodiments of light emitting device package structures 500m, 500n, 500o and 500p having fluorescent layers 236a and 236b of the invention. The light emitting device package structures 500m, 500n, 500o and 500p may comprise a white or colored light emitting device package structure, thereby emitting white or colored light. FIGS. 8a to 8d illustrate the light emitting device package structures 500m, 500n, 500o and 500p with the light emitting device chip 300 as shown in FIG. 2c and FIG. 3c. Before assembling the wafer 200 and the covering plate 212, a fluorescent layer 236a or 236b may be formed between the light emitting device chip 300 and the covering plate 212. As shown in FIGS. 8a and 8c, fluorescent powders, for example, phosphorus powders, may cover a surface of the covering plate 212 facing the light emitting device chip 300 to form a fluorescent layer 236a by a coating process. Next, the wafer 200 and the covering plate 212 are oppositely assembled to form the light emitting device package structures 500m and 500o having the cavity 213. The fluorescent layer 236a is connected to the covering plate 212. Also, the fluorescent layer 236a and the light emitting device chip 300 are separated by a distance. Alternatively, the fluorescent powders may be uniformly spread in the spacer structure 210. Therefore, the spacer structure 210 may have a function of a fluorescent layer to improve the luminance efficiency of the light emitting device package structure. Alternatively, as shown in FIGS. 8b and 8d, fluorescent powders, for example, phosphorus powders, may be mixed with an optical adhesive, for example, epoxy or silicone. Therefore, the fluorescent powders may be uniformly spread in the optical adhesive. Next, the optical adhesive with fluorescent powders may cover the light emitting device chip 300 to form a fluorescent layer 236b by coating. Next, the wafer 200 and the covering plate 212 are oppositely assembled to form the light emitting device package structures 500n and 500p without a cavity therebetween. The fluorescent layer 236b may be filled between the light emitting device chip 300 and the covering plate 212. In embodiments as shown in FIG. 8b and 8d, the fluorescent layer 236b may replace the adhesive layer 208b to bond the light emitting device chip 300 and the covering plate 212 together because the fluorescent layer 236b is a glue layer having fluorescent powders therein. Heat dissipating structures of the light emitting device package structures having the fluorescent layers may comprise the via plugs 232 or the heat dissipating material layer 234 as shown in FIGS. 6a to 6b or FIGS. 7a to 7d.

Figure 9:
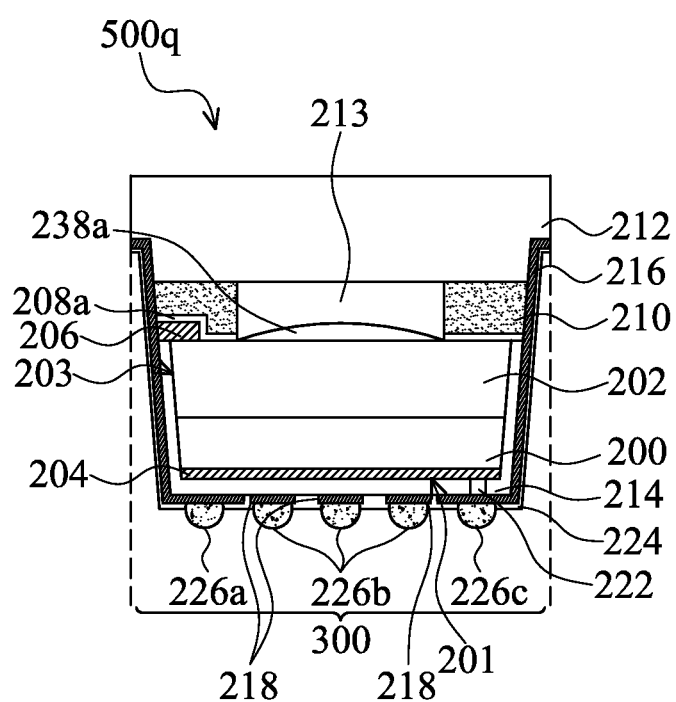
FIG. 9 is a cross section of other exemplary embodiments of a light emitting device package structure having a micro-lens structure of the invention.
Figure 10A:
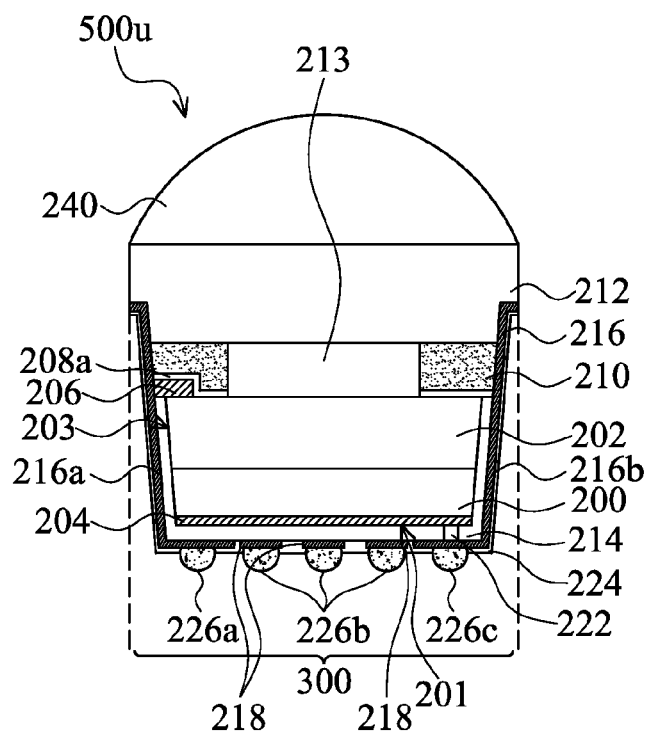
FIGS. 10a to 10d are cross sections of other exemplary embodiments of a light emitting device package structure having a lens structure of the invention.
Figure 10B:
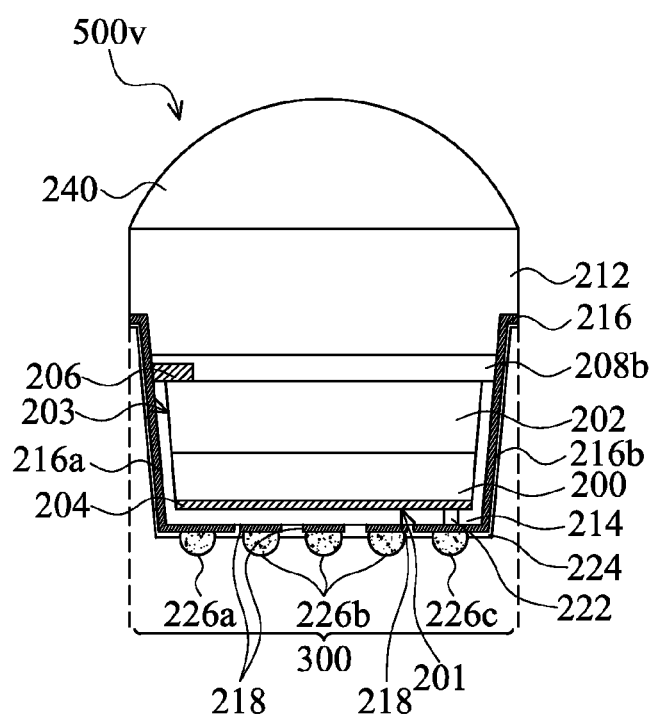
Figure 10C:
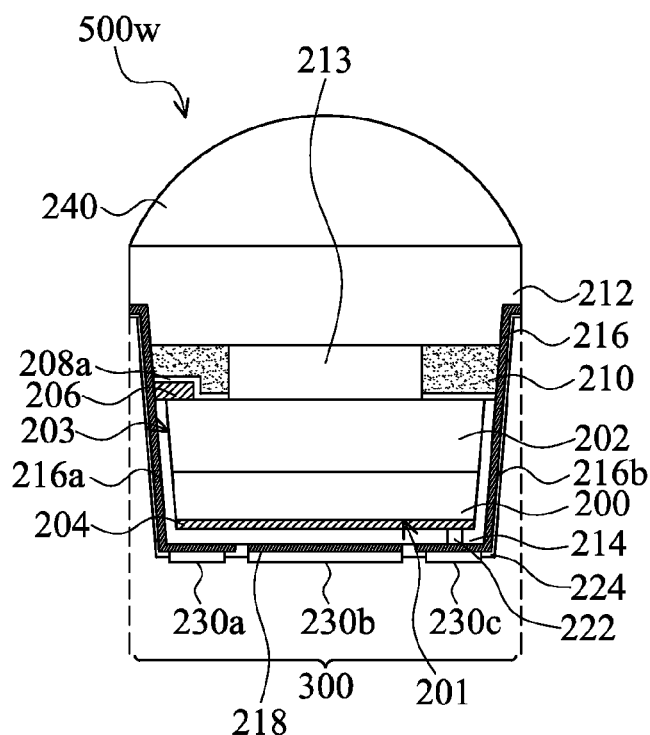
Figure 10D:
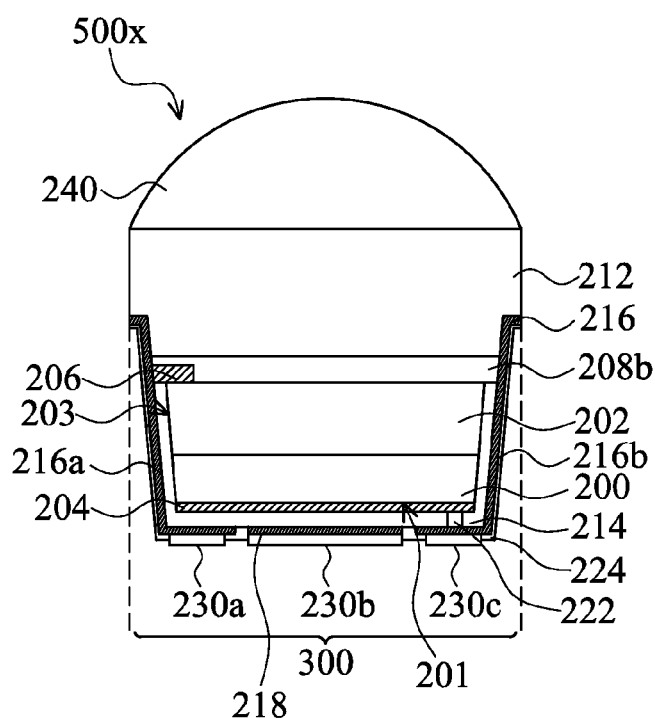

FIG. 9 is a cross section of other exemplary embodiments of a light emitting device package structure 500q having a microlens structure 238a of the invention. FIG. 9 illustrates the light emitting device package structure 500q with the light emitting device chip 300 as shown in FIG. 2c. Before bonding the wafer 200 and the covering plate 212, a microlens structure 238a may be formed on the light emitting device chip 300, between the light emitting device chip 300 and the covering plate 212. The microlens structure 238a may be used to guide and focus the light emitted from the light emitting device chip 300. Therefore, the microlens structure 238a may be used in a light emitting device array design. The microlens structure 238a as shown in FIG. 9 is disposed in the cavity 213 with a position corresponding to the light emitting device chip 300. The microlens structure 238a may be disposed by customized requirements. Heat dissipating structures of the light emitting device package structure having the microlens structure 238a may comprise the via plugs 232 or the heat dissipating material layer 234 as shown in FIGS. 6a to 6b or FIGS. 7a to 7d. Additionally, in the light emitting device package structure having the microlens structure 238a, the fluorescent layer 236b as shown in FIGS. 8a to 8d may be disposed between the light emitting device chip 300 and the covering plate 212. Alternatively, the fluorescent layer 236b as shown in FIGS. 8a to 8d may be disposed covering the microlens structure 238a.

FIGS. 10a to 10d are cross sections of other exemplary embodiments of light emitting device package structures 500u, 500v, 500w and 500x having lens structures 240 of the invention. FIGS. 10a to 10d illustrate the light emitting device package structures 500u, 500v, 500w and 500x with the light emitting device chip 300 as shown in FIG. 2c and FIG. 3c. After forming the light emitting device package structures 500u, 500v, 500w and 500x, a lens structure 240 may be selectively formed on the covering plate 212. The lens structure 240 may be disposed by customized requirements. Heat dissipating structures of the light emitting device package structure having the lens structure 240 may comprise the via plugs 232 or the heat dissipating material layer 234 as shown in FIGS. 6a to 6b or FIGS. 7a to 7d. Additionally, in the light emitting device package structure having the lens structure 240, the fluorescent layer 236b as shown in FIGS. 8a to 8d may be disposed between the light emitting device chip 300 and the covering plate 212.

Figure 11A:
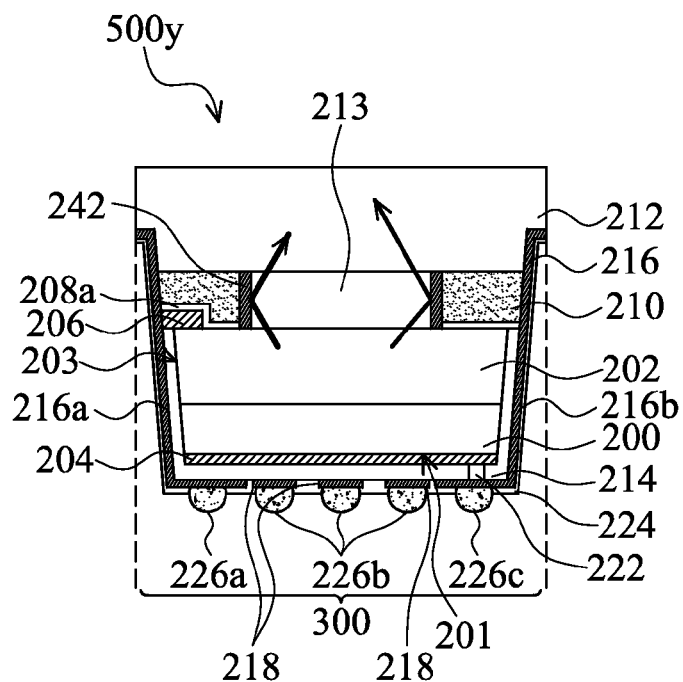
FIGS. 11a and 11b are cross sections of other exemplary embodiments of a light emitting device package structure having a reflection device of the invention.
Figure 11B:
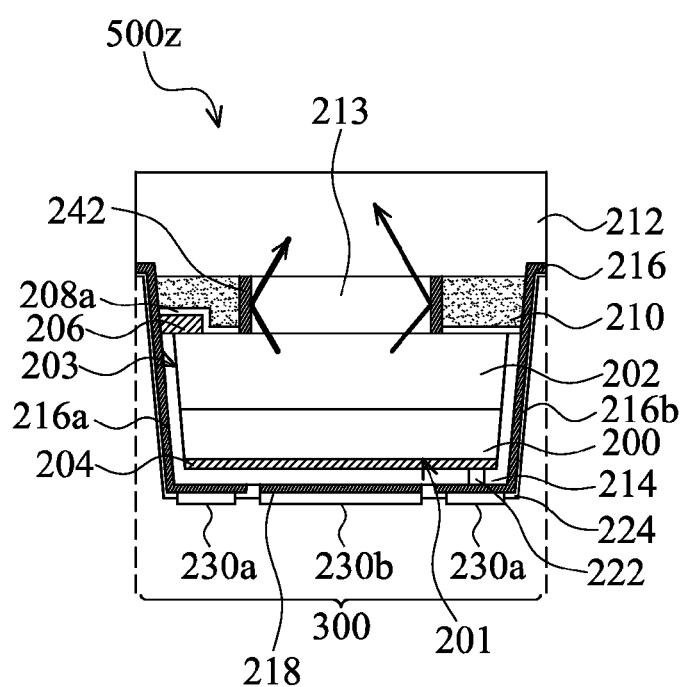

FIGS. 11a and 11b are cross sections of other exemplary embodiments of light emitting device package structures 500y and 500z having reflection devices 242 of the invention. The light emitting device package structures 500y and 500z having the reflection devices 242 may be used for a light emitting device package structure having the cavity 213. FIGS. 11a and 11b illustrate the light emitting device package structures 500y and 500z with the light emitting device chip 300 as shown in FIG. 2c. Before bonding the wafer 200 and the covering plate 212, a reflecting layer comprising metal or dielectric materials may cover the spacer structure 210, thereby forming a reflection device 242 on a sidewall of the spacer structure 210 adjacent to the cavity 213. The reflection device 242 may have a predetermined tilted angle. The reflection device 242 may improve luminance efficiency because the reflection device 242 may block the light emitted from the semiconductor layer 202 to the spacer structure 210 (as shown an arrow in FIGS. 11a and 11b) while reflecting the light to a region directly on the semiconductor layer 202. Finally, the light emitted from the semiconductor layer 202 to the spacer structure 210 may be reflected outwardly to the atmosphere through the covering plate 212. Therefore, the reflection device 242 may used to improve luminance efficiency of the semiconductor layer 202. In other embodiments, the spacer structure 210 may be doped with dielectric materials therein. Alternatively, the spacer structure 210 may be formed using the dielectric materials to improve luminance efficiency of the semiconductor layer 202 because the spacer structure 210 has a function of reflection resulting from the dielectric constant (k) differences between the spacer structure 210 and the cavity 213.

One exemplary embodiment of the light emitting device package structure comprises a light emitting device chip 300 having a semiconductor layer 202. An electrode layer 206 is disposed on the semiconductor layer 202 and is electrically connected to the semiconductor layer 202. A covering plate 212 is disposed on a light emitting surface of the light emitting device chip 300. A conductive trace 216 is conformably disposed on a side 203 and a backside 201 of the light emitting device chip 300, electrically connecting to the electrode layer 206.

Some advantages of an exemplary embodiment of the light emitting device package structure are described in the following. The light emitting device package structure is fabricated using a wafer level chip scale package (WLCSP) process to package a light emitting device. Therefore, the light emitting device package structure has much smaller dimensions than that of the conventional wire-bonding type light emitting device package structure. When the light emitting device package structure is arranged in a pixel array for illumination or display, an exemplary embodiment of the light emitting device package structure may make the pixel array have a smaller pitch between each light emitting device. Therefore, pixel continuity and visual effect are improved. A method for fabricating an exemplary embodiment of the light emitting device package structure may manufacture the conductive traces, the heat dissipating structures, the fluorescent layers and the microlens on a plurality of the light emitting devices at the same time. Next, the wafer is cut to divide each packaged light emitting device chip. An exemplary embodiment of the light emitting device package structure is formed without leadframes or bonding wires used in the conventional wire-bonding type light emitting device package structure. Compared to the conventional wire-bonding type light emitting device package structure, an exemplary embodiment of the light emitting device package structure has a simpler and quicker fabrication process. The throughput to the fabrication process is faster. Also, an exemplary embodiment of the light emitting device package structure may require less fabrication time than the conventional wire-bonding type light emitting device package structure in the device testing process. In one exemplary embodiment of a light emitting device package structure, a distance between the semiconductor layer and the light emitting device package structure is much shorter than that of the conventional wire-bonding type light emitting device package structure for the light emitting device. Also, the heat dissipating structure comprising the heat dissipating material layer, the heat dissipating solder balls and the heat dissipating solder pads is directly below the backside of the wafer without being separated by a print circuit board. Therefore, heat generated from the light emitting device chip may transfer to the atmosphere quickly and heat resistance of the light emitting device package structure can be further reduced. The light emitting device package structures have improved heat dissipating efficiency and reliability.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light emitting device package structure, comprising:
a substrate serving as a carrier supporting a light emitting device chip, wherein the substrate and the light emitting device chip having a chip side and a substrate side separately;
a first electrode layer disposed on a first surface of the light emitting device chip;
a second electrode layer disposed on a second surface of the light emitting device chip, wherein the first surface and the second surface are not coplanar;
a first conductive trace electrically connected to the first electrode layer;
a second conductive trace electrically connected to the second electrode layer, wherein at least the first conductive trace or the second conductive trace is formed along the chip side and the substrate side simultaneously;
a covering plate disposed on a light emitting surface of the light emitting device chip;
a spacer structure surrounding a light emitting surface of the light emitting device chip; and
a reflection device on an inner side or an outer side of the spacer structure.

2. The light emitting device package structure as claimed in claim 1, wherein at least the first conductive trace or the second conductive trace is further extended to under the substrate.

3. The light emitting device package structure as claimed in claim 1, wherein at least the first conductive trace or the second conductive trace is conformably formed along the chip side and the substrate side.

4. The light emitting device package structure as claimed in claim 1, further comprising:
an insulating layer covering the chip side and the substrate side.

5. A light emitting device package structure, comprising:
a substrate serving as a carrier supporting a light emitting device chip, wherein the substrate and the light emitting device chip having a chip side and a substrate side separately;
a first electrode layer disposed on a first surface of the light emitting device chip;
a second electrode layer disposed on a second surface of the light emitting device chip, wherein the first surface and the second surface are not coplanar;
a first conductive trace electrically connected to the first electrode layer; and
a second conductive trace electrically connected to the second electrode layer, wherein at least the first conductive trace or the second conductive trace is conformably formed along the chip side and the substrate side simultaneously and further extended to under the substrate;
a covering plate disposed on a light emitting surface of the light emitting device chip;
a spacer structure surrounding a light emitting surface of the light emitting device chip; and
a reflection device on an inner side or an outer side of the spacer structure.

6. A light emitting device package structure, comprising:
a substrate serving as a carrier supporting a light emitting device chip, wherein the substrate and the light emitting device chip having a chip side and a substrate side separately;
a first electrode layer disposed on a first surface of the light emitting device chip;
a second electrode layer disposed on a second surface of the light emitting device chip, wherein the first surface and the second surface are not coplanar;
a first conductive trace electrically connected to the first electrode layer;
a second conductive trace electrically connected to the second electrode layer, wherein at least the first conductive trace or the second conductive trace is formed along the chip side and the substrate side simultaneously;
a covering plate disposed on a light emitting surface of the light emitting device chip;
an insulating layer covering the chip side and the substrate side;
a spacer structure surrounding a light emitting surface of the light emitting device chip; and
a reflection device on an inner side or an outer side of the spacer structure.

7. The light emitting device package structure as claimed in claim 6, wherein the first surface and the second surface are formed on the light emitting surface of the light emitting device chip or on two opposite surfaces thereof.

8. The light emitting device package structure as claimed in claim 1, wherein the first surface and the second surface are at opposite sides of the light emitting device chip.

9. The light emitting device package structure as claimed in claim 5, wherein the first surface and the second surface are at opposite sides of the light emitting device chip.

10. The light emitting device package structure as claimed in claim 6, wherein the first surface and the second surface are at opposite sides of the light emitting device chip.

* * * * *